United States Patent
Chan et al.

(10) Patent No.: US 6,677,793 B1
(45) Date of Patent: Jan. 13, 2004

(54) AUTOMATIC DELAY MATCHING CIRCUIT FOR DATA SERIALIZER

(75) Inventors: Kai Keung Chan, Fremont, CA (US); Jung-Sheng Hoei, Newark, CA (US); Pankaj Joshi, Milpitas, CA (US); Leo Fang, Belmont, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/357,827

(22) Filed: Feb. 3, 2003

(51) Int. Cl.[7] ............................................. H03L 7/06
(52) U.S. Cl. .................................. 327/158; 327/291
(58) Field of Search .............................. 327/156, 158, 327/291, 149, 245, 270, 237

(56) References Cited

U.S. PATENT DOCUMENTS

| | | | |
|---|---|---|---|
| 6,294,938 B1 | * 9/2001 | Coddington et al. | 327/158 |
| 6,340,909 B1 | * 1/2002 | Zerbe et al. | 327/246 |
| 6,359,486 B1 | 3/2002 | Chen | 327/231 |
| 6,539,072 B1 | * 3/2003 | Donnelly et al. | 375/371 |
| 6,556,489 B2 | * 4/2003 | Gomm et al. | 365/194 |

* cited by examiner

Primary Examiner—Dinh T. Le
(74) Attorney, Agent, or Firm—Fitch, Even, Tabin & Flannery (57) ABSTRACT

An automatic delay matching circuit for a data serializer includes a phase-locked loop for synthesizing a transmitter clock signal for an external circuit, a phase interpolator coupled to the phase-locked loop for delaying or advancing the transmitter clock signal in response to a phase control signal to generate a delayed or advanced transmitter clock signal for the data serializer, a phase detector for measuring a phase difference between the delayed or advanced transmitter clock signal further delayed through the data serializer and the transmitter clock signal delayed through an external circuit, and a loop filter coupled to the phase detector for generating the phase control signal as a function of the phase difference between the delayed or advanced transmitter clock signal further delayed through the data serializer and the transmitter clock signal delayed through the external circuit.

13 Claims, 6 Drawing Sheets

AUTOMATIC DELAY MATCHING CIRCUIT FOR DATA SERIALIZER

BACKGROUND OF THE INVENTION

1. Field of the Invention

The present invention is directed generally to converting parallel data to serial, high speed differential signals. More specifically, but without limitation thereto, the present invention is directed to a method of deskewing an internal clock of a data serializer with respect to an external ASIC core.

2. Description of the Prior Art

In integrated circuit design, a transmitter for serializing parallel data is integrated with an Application-Specific Integrated Circuit (ASIC) core design supplied by a customer to an integrated circuit manufacturer. To properly transfer data between the transmitter and the ASIC core, the insertion delay of the clock signal from the ASIC must be matched to the clock signal of the data serializer in the transmitter.

SUMMARY OF THE INVENTION

In one aspect of the present invention, an automatic delay matching circuit for a data serializer includes a phase-locked loop for synthesizing a transmitter clock signal for an external circuit, a phase interpolator coupled to the phase-locked loop for delaying or advancing the transmitter clock signal in response to a phase control signal to generate a delayed or advanced transmitter clock signal for the data serializer, a phase detector for measuring a phase difference between the delayed or advanced transmitter clock signal further delayed through the data serializer and the transmitter clock signal delayed through an external circuit, and a loop filter coupled to the phase detector for generating the phase control signal as a function of the phase difference between the delayed or advanced transmitter clock signal further delayed through the data serializer and the transmitter clock signal delayed through the external circuit.

In another aspect of the present invention, a method of delay matching for a data serializer includes steps for synthesizing a transmitter clock signal, delaying or advancing the transmitter clock signal in response to a phase control signal to generate a delayed or advanced transmitter clock signal, measuring a phase difference between the transmitter clock signal delayed through an external circuit and the delayed or advanced transmitter clock signal further delayed through the data serializer, and generating the phase control signal as a function of the phase difference between the delayed or advanced transmitter clock signal further delayed through the data serializer and the transmitter clock signal delayed through the external circuit.

DESCRIPTION OF THE DRAWINGS

The present invention is illustrated by way of example and not limitation in the accompanying figures, in which like references indicate similar elements throughout the several views of the drawings, and in which.

To simplify referencing in the description of the illustrated embodiments of the present invention, indicia in the figures may be used interchangeably to identify both the signals that are communicated between the elements and the connections that carry the signals. For example, an address communicated on an address bus may be referenced by the same number used to identify the address bus.

Elements in the figures are illustrated for simplicity and clarity and have not necessarily been drawn to scale. For example, the dimensions of some of the elements in the figures may be exaggerated relative to other elements to help to improve understanding of the following description of the illustrated embodiments.

DESCRIPTION OF THE ILLUSTRATED EMBODIMENTS

In low latency transceiver applications, a transmitter typically serializes relatively low speed parallel data to high speed serial differential signals, and a receiver converts the high speed serial differential signals into low speed parallel data. An advantage of this method of data transfer is that fewer channels or data lines are required to connect the data source and destination.

The transmitter, or data serializer, is typically designed as a hard macro and is made available for incorporation into an integrated circuit. When an external circuit is added to the integrated circuit, the insertion delay of the clock tree in the external circuit must be matched to the insertion delay of the data serializer to transfer data between the data serializer and the external circuit. Typically, the delay matching process is repeated for each external circuit, which may result in a substantial expenditure in time and circuit design resources.

Figure 1:
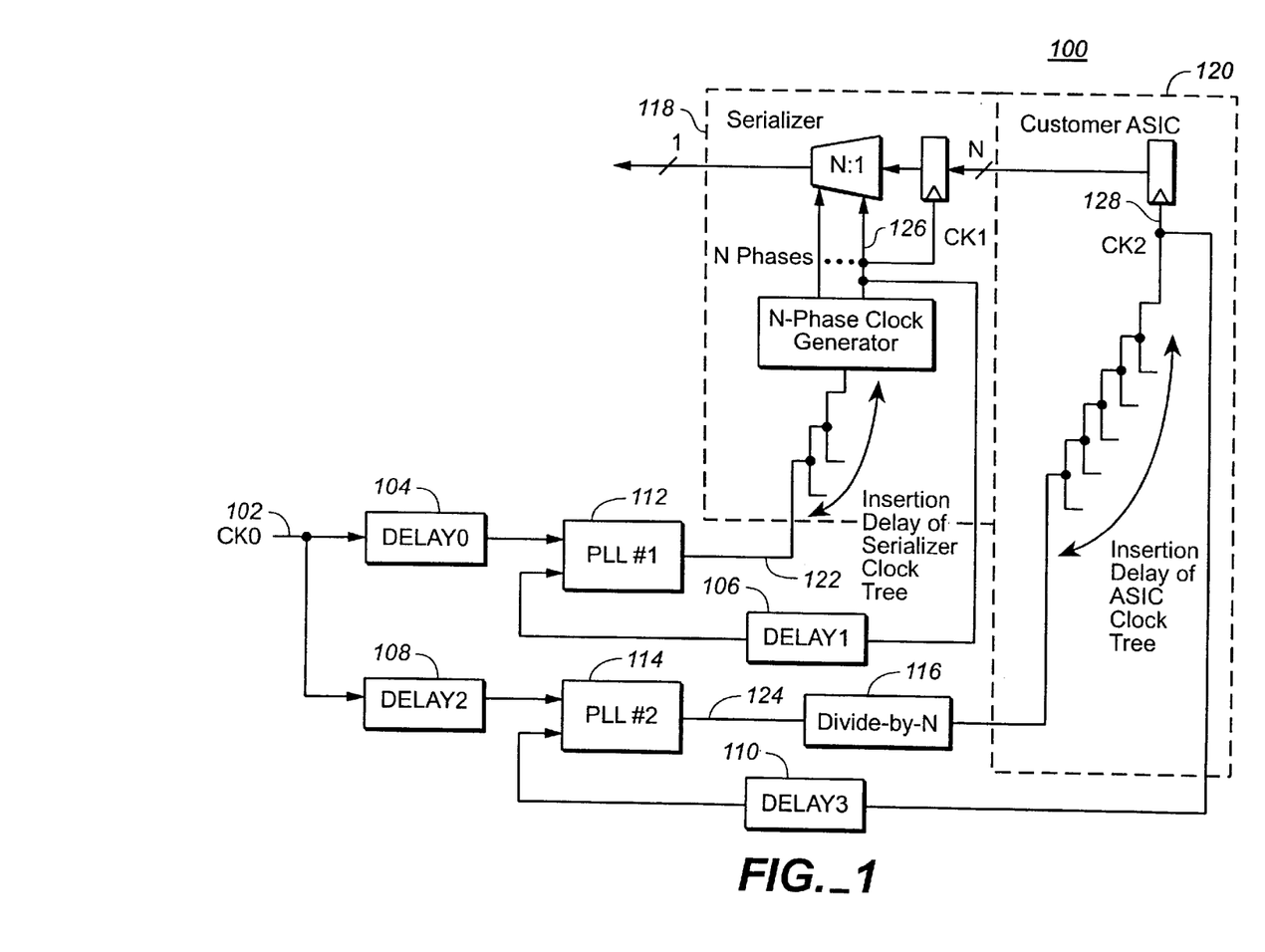
FIG. 1 illustrates a delay matching circuit for a data serializer of the prior art with two phase-locked loops and balanced delays.

FIG. 1 illustrates a delay matching circuit 100 for a data serializer of the prior art with two phase-locked loops and balanced delays. Shown in FIG. 1 are a reference clock signal 102, a first selected delay 104, a second selected delay 106, a third selected delay 108, a fourth selected delay 110, a first phase-locked loop 112, a second phase-locked loop 114, a divider 116, a data serializer 118, an external circuit 120, a first clock signal 122, a second clock signal 124, a data serializer clock signal 126, and an external clock signal 128.

The reference clock signal 102 is generated according to well known techniques and is connected to the first selected delay 104 and the third selected delay 108. The first phase-locked loop 112 receives the reference signal 102 delayed by the first selected delay 104. The first phase-locked loop 112 may be implemented, for example, by a macro from an applications circuit library. Alternatively, the first phase-locked loop 112 may be designed and incorporated into the automatic delay matching circuit 100 according to well-known techniques to generate the first clock signal 122. The first clock signal 122 is further delayed through the insertion delay of the clock tree in the data serializer 118, resulting in the data serializer clock signal 126. The second selected delay 106 balances the first selected delay 104 so that the data serializer clock signal 126 has the same phase as the reference clock signal 102 when the first phase-locked loop 112 locks the phase of the data serializer clock signal 126 delayed by the second selected delay 106 with the reference clock signal 102 delayed by the first selected delay 104.

The second phase-locked loop 114 receives the reference signal 102 delayed by the third selected delay 108 and generates the second clock signal 124. The second clock signal 124 is divided by the divider 116 to select a single clock phase and is further delayed through the insertion delay of the clock tree in the external circuit 120, resulting in the external clock signal 128. The external circuit 120 may be, for example, an Application-Specific Integrated Circuit (ASIC) core provided by a customer for incorporation with the data serializer 118 into an integrated circuit. The fourth selected delay 110 balances the third selected delay 108 so that the external clock signal 128 has the same phase as the reference clock signal 102 when the second phase-locked loop 114 locks the phase of the external clock signal 128 delayed by the fourth selected delay 110 with the reference clock signal 102 delayed by the third selected delay 108.

When the first phase-locked loop 112 and the second phase-locked loop 114 are phase-locked, the data serializer clock signal 126 and the external clock signal 128 have the same phase as the reference clock signal 102. A disadvantage of the delay matching circuit 100 is that two phase locked loops are required and that the selected delays must be balanced for each new external circuit 120.

Figure 2:
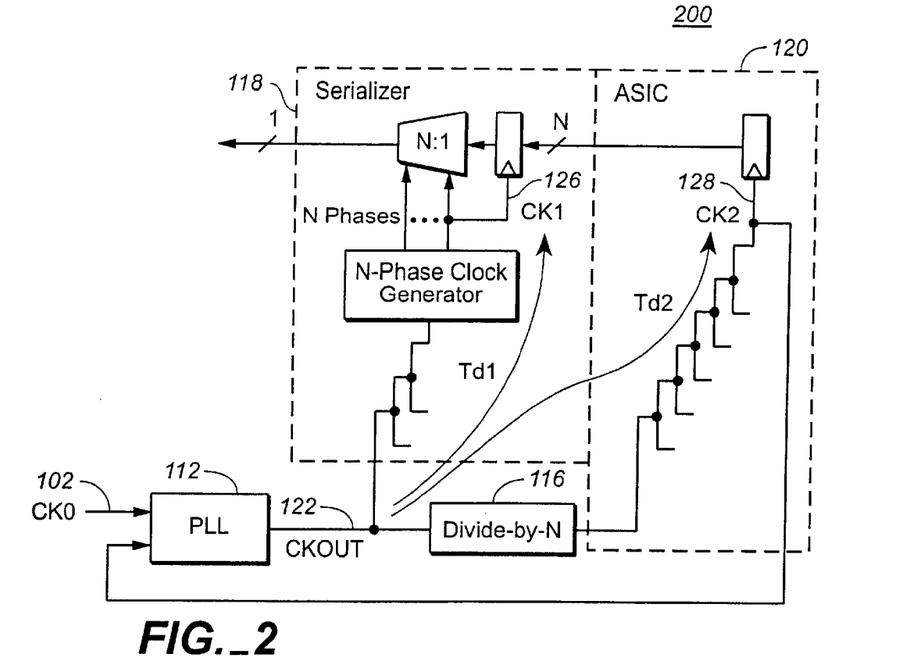
FIG. 2 illustrates a delay matching circuit for a data serializer of the prior art with insertion delay matching.

FIG. 2 illustrates a delay matching circuit 200 for a data serializer of the prior art with insertion delay matching. Shown in FIG. 2 are a reference clock signal 102, a phase-locked loop 112, a divider 116, a data serializer 118, an external circuit 120, a first clock signal 122, a data serializer clock signal 126, and an external clock signal 128.

The reference clock signal 102 is connected to the phase-locked loop 112. The phase-locked loop 112 generates the first clock signal 122. The first clock signal 122 is further delayed through the insertion delay of the clock tree in the data serializer 118, resulting in the data serializer clock signal 126. The first clock signal 122 is also divided by the divider 116 to select a single clock phase and is further delayed through the insertion delay of the clock tree in the external circuit 120, resulting in the external clock signal 128. The insertion delay Td1 of the clock tree in the data serializer 118 and the insertion delay Td2 of the clock tree in the external circuit 120 are delay matched during the placement and routing backend design process so that the data serializer clock signal 126 and the external clock signal 128 have the same phase as the reference clock signal 102 when the phase-locked loop 112 locks the phase of the external clock signal 128 with the reference clock signal 102. A disadvantage of the delay matching circuit 200 is that the insertion delay matching process must be performed for each new external circuit 120, which may result in a substantial expenditure in time and circuit design resources.

Figure 3:
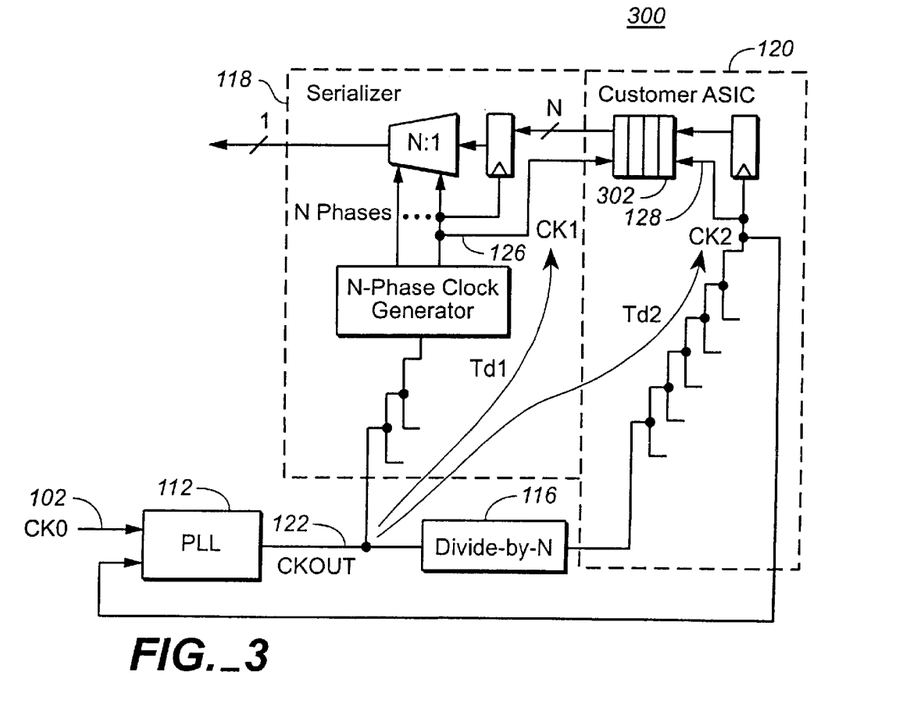
FIG. 3 illustrates a delay matching circuit for a data serializer of the prior art with a FIFO.

FIG. 3 illustrates a delay matching circuit 300 for a data serializer of the prior art with a FIFO. Shown in FIG. 3 are a reference clock signal 102, a phase-locked loop 112, a divider 116, a data serializer 118, an external circuit 120, a first clock signal 122, a data serializer clock signal 126, an external clock signal 128, and a FIFO 302.

The delay matching circuit 300 is similar to that of FIG. 2, however, the insertion delay Td1 of the clock tree in the data serializer 118 and the insertion delay Td2 of the clock tree in the external circuit 120 do not need to be delay matched. Instead, the First-In, First-Out (FIFO) 302 absorbs the delay difference. A disadvantage of the delay matching circuit 300 is that a substantial latency is added between the data serializer 118 and the external circuit 120, depending on the depth of the FIFO 302. The added latency may not be suitable for high performance applications that require a low latency between the data serializer 118 and the external circuit 120.

In an automatic delay matching circuit of the present invention, a phase interpolator provides an adjustable delay for matching the delay between the data serializer clock signal and the external clock signal. The automatic delay matching circuit of the present invention may readily be incorporated into a single integrated circuit with the data serializer and the external circuit according to well-known techniques.

In one aspect of the present invention, an automatic delay matching circuit for a data serializer includes a phase-locked loop for synthesizing a transmitter clock signal for an external circuit, a phase interpolator coupled to the phase-locked loop for delaying or advancing the transmitter clock signal in response to a phase control signal to generate a delayed or advanced transmitter clock signal for the data serializer, a phase detector for measuring a phase difference between the delayed or advanced transmitter clock signal further delayed through the data serializer and the transmitter clock signal delayed through an external circuit, and a loop filter coupled to the phase detector for generating the phase control signal as a function of the phase difference between the delayed or advanced transmitter clock signal further delayed through the data serializer and the transmitter clock signal delayed through the external circuit.

Figure 4:
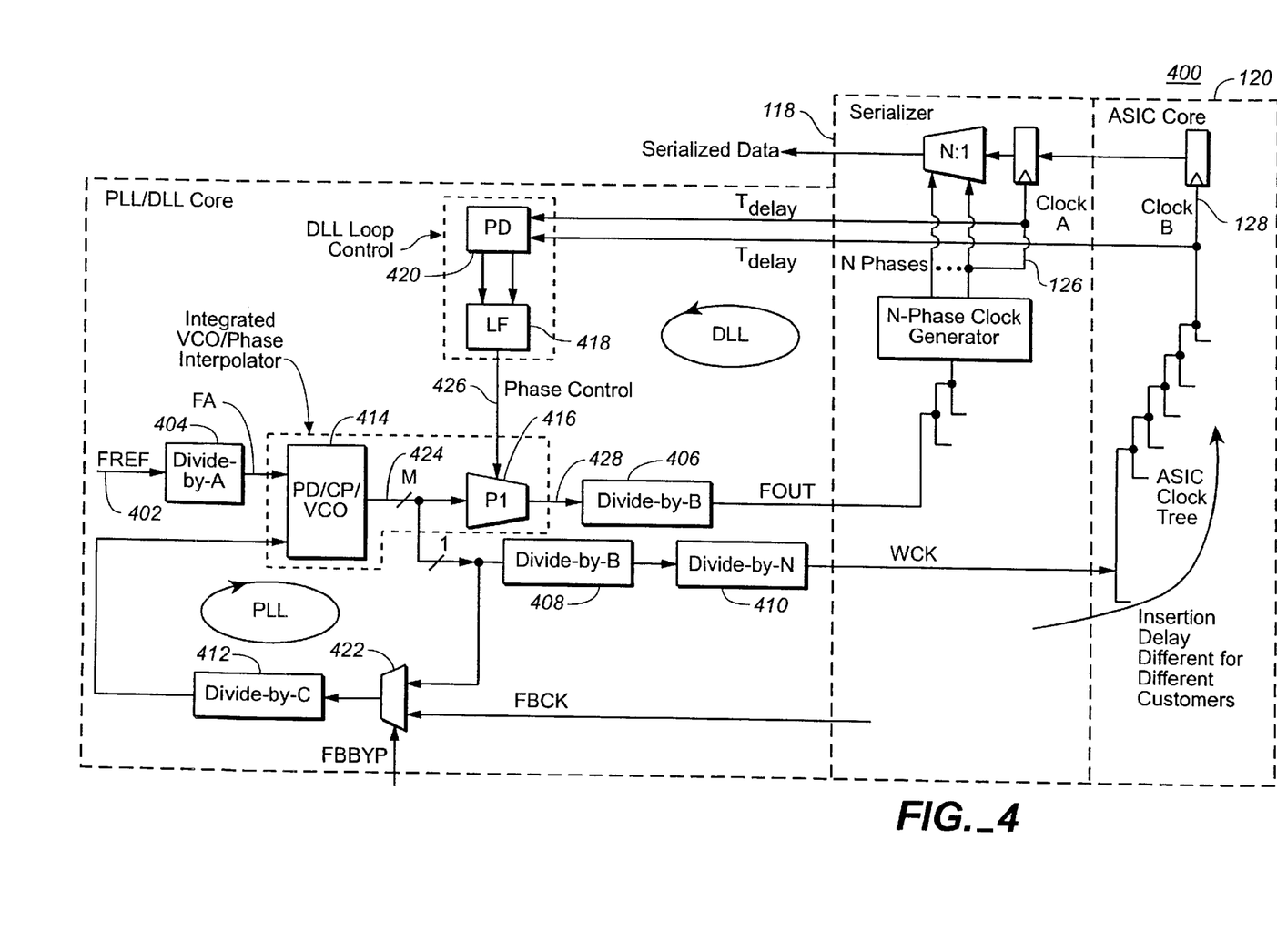
FIG. 4 illustrates an automatic delay matching circuit for a data serializer according to an embodiment of the present invention.

FIG. 4 illustrates an automatic delay matching circuit 400 for a data serializer according to an embodiment of the present invention. Shown in FIG. 4 are a data serializer 118, an external circuit 120, a data serializer clock signal 126, an external clock signal 128, a system clock signal 402, a first divider 404, a second divider 406, a third divider 408, a fourth divider 410, a fifth divider 412, a phase-locked loop 414, a phase interpolator 416, a loop filter 418, a phase detector 420, a multiplexer 422, a multiple phase clock signal 424, a phase control signal 426, and a delayed clock signal 428.

The phase-locked loop 414 receives as input a reference clock signal from the system clock signal 402 divided by A from the first divider 404 and a phase difference clock signal from the fifth divider 412. The phase-locked loop 414 typically includes a phase detector, a comparator, and a voltage-controlled oscillator. The first divider 404 may be, for example, a generic divider that divides the input frequency by a natural number 1, 2, 3, 4, . . . to support different input frequencies FREF in various embodiments of the present invention to suit specific applications. For example, if FREF frequencies of 33 MHz and 66 MHz are to be supported, then a value of A equal to 1 may be selected if FREF is equal to 33 MHz or a value of A equal to 2 may be selected if FREF is equal to 66 MHz such that the output frequency FA remains at 33 MHz for either FREF frequency. Selecting the value of A such that the output frequency FA remains the same for any input frequency FREF simplifies the design of the internal circuitry for a narrow range of frequencies, such as 33 MHz in this example. The multiplexer 422 allows the circuit designer to select either the internal feedback signal from the phase-locked loop 414 or an external feedback signal FBCK in response to a switching signal FBBYP. The phase-locked loop 414 generates the multiple phase clock signal 424.

The data serializer clock signal 126, the external clock signal 128, the phase interpolator 416, the loop filter 418, the second divider 406, the third divider 408, the fourth divider 410, the phase detector 420, the phase control signal 426, and the delayed clock signal 428 constitute a delay-locked loop that matches the insertion delays in the data serializer 118 and the external circuit 120 as follows.

The phase interpolator 416 receives as input the multiple phase clock signal 424 from the phase-locked loop 414 and the phase control signal 426 and generates the delayed or advanced clock signal 428. An example of a phase interpolator circuit suitable for incorporating into the automatic delay matching circuit 400 is described by Chen, U.S. Pat. No. 6,359,496 B1, incorporated herein by reference. The second divider 406 may be, for example, a generic divider that divides the delayed or advanced clock signal 428 by a natural number 1, 2, 3, 4, . . . . The values of A, B, and C may be selected to provide a wide range of frequencies for the output FOUT while the phase-locked loop 414 need only be designed to accommodate a narrow frequency range. The resulting clock signal FOUT is further delayed by the insertion delay in the data serializer 118, resulting in the data serializer clock signal 126.

A single phase of the multiple phase clock signal 424 from the phase-locked loop 414 is also divided by B in the third divider 408 and matched to the frequency of the data serializer clock signal 126 by the fourth divider 410. The divided clock signal from the fourth divider 410 is delayed by the insertion delay of the external circuit 120, resulting in the external clock signal 128.

The phase detector 420 measures the phase difference between the data serializer clock signal 126 and the external clock signal 128 and generates an output that is proportional to the phase difference. The loop filter 418 filters the output of the phase detector 420 and generates the phase control signal 426. The phase control signal 426 adjusts the delay in the phase interpolator 416 until there is substantially zero phase difference between the data serializer clock signal 126 and the external clock signal 128.

Figure 5:
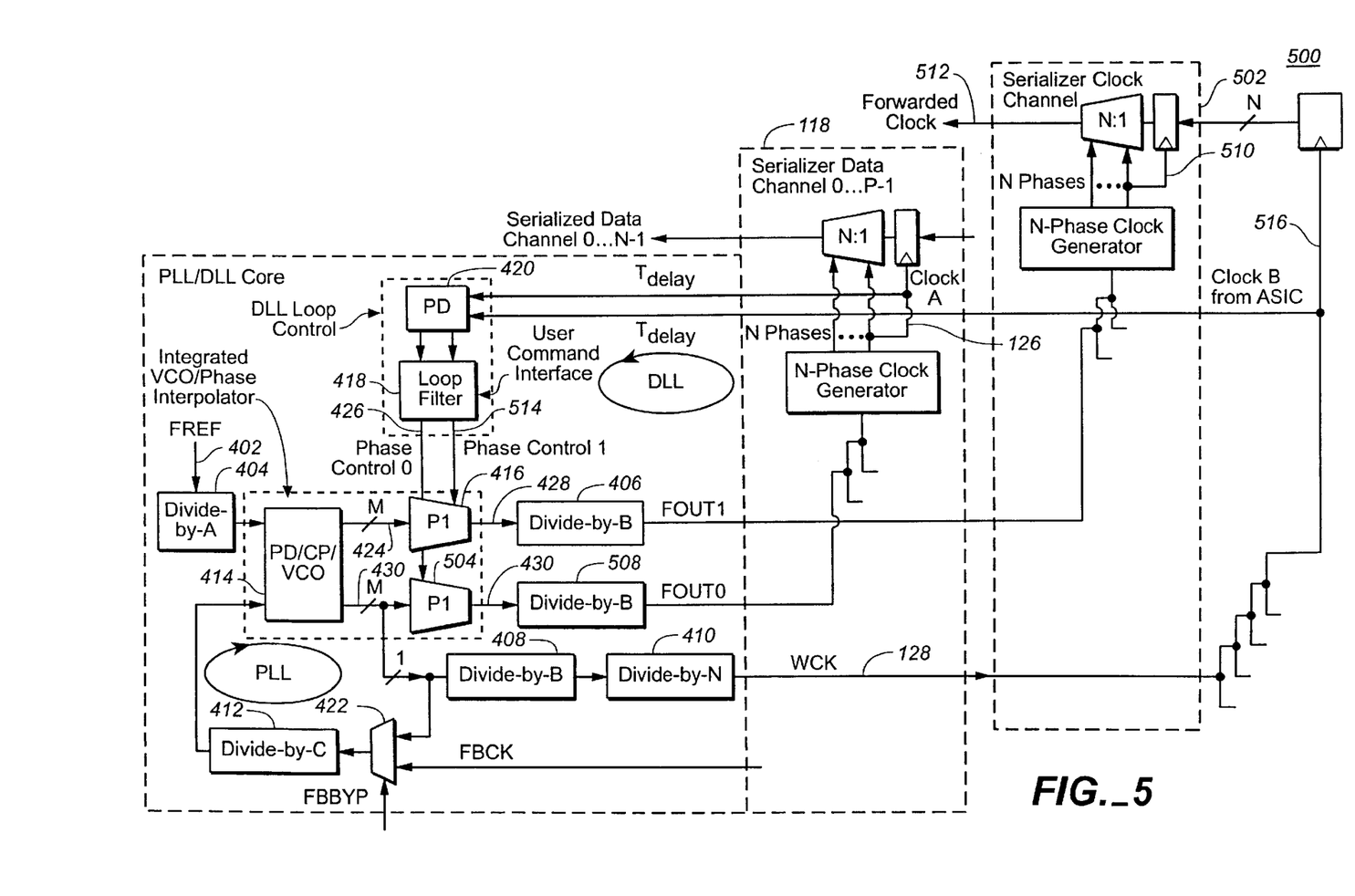
FIG. 5 illustrates an automatic delay matching circuit for a data serializer and a clock serializer according to an embodiment of the present invention.

FIG. 5 illustrates an automatic delay matching circuit 500 for a data serializer and a clock serializer according to an embodiment of the present invention. Shown in FIG. 5 are a data serializer 118, an external circuit 120, a data serializer clock signal 126, an external clock signal 128, a system clock signal 402, a first divider 404, a second divider 406, a third divider 408, a fourth divider 410, a fifth divider 412, a phase-locked loop 414, a phase detector 420, a multiplexer 422, a multiple phase clock signal 424, a phase control signal 426, a delayed clock signal 428, a clock serializer 502, a second phase interpolator 504, a sixth divider 508, a clock serializer clock signal 510, a forwarded clock signal 512, a second phase control signal 514, an ASIC clock signal 516, and a user command interface bus 518.

The phase-locked loop 414 receives as input a reference clock signal from the system clock signal 402 divided by A in the first divider 404 and a phase difference clock signal from the fifth divider 412 and generates the multiple phase clock signal 424. The data serializer clock signal 126, the clock serializer clock signal 510, the phase interpolator 416, the loop filter 418, the phase detector 420, the second divider 406, the phase detector 420, the second phase control signal 514, and the delayed or advanced clock signal 428 constitute a delay-locked loop that matches the insertion delays in the data serializer 118 and the external circuit as follows.

The phase interpolator 416 receives as input the multiple phase clock signal 424 from the phase-locked loop 414 and the phase control signal 426 and generates the delayed clock signal 428. The second divider 406 divides the delayed clock signal 428 by B, and the resulting divided delayed clock is further delayed by the insertion delay in the data serializer 118, resulting in the data serializer clock signal 126.

The phase detector 420 measures the phase difference between the data serializer clock signal 126 and the clock serializer clock signal 510 and generates an output that is a function of the phase difference, typically a pulsed DC voltage that is proportional to the phase difference between the data serializer clock signal 126 and the ASIC clock signal 516. The loop filter 418 filters the output of the phase detector 420, resulting in the phase control signal 426 and the second phase control signal 514. The phase interpolator 416 adjusts the delay in the delayed or advanced clock signal 428 resulting in the data serializer clock signal 126 in response to the phase control signal 426 and the second phase interpolator 504 adjusts the delay in the delayed clock signal 428 resulting in the clock serializer clock signal 510 in response to the second phase control signal 514. The desired phase difference is programmed on the user command interface bus 518 to the loop filter 418, for example, by a bus of digitally controlled signals.

Figure 6:
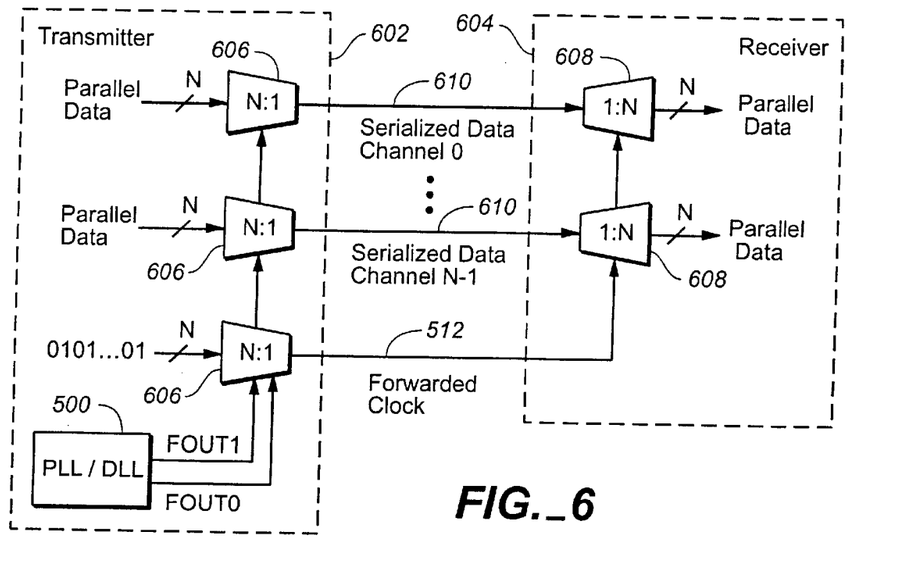
FIG. 6 illustrates a transmitter and a receiver using the automatic delay matching circuit of FIG. 5.

FIG. 6 illustrates a transmitter and a receiver using the automatic delay matching circuit 500 of FIG. 5. Shown in FIG. 6 are a transmitter 602 and a receiver 604. The transmitter 602 includes data serializers 606 and the automatic delay matching circuit 500. The receiver 604 includes de-serializers 608. The transmitter 602 generates the serialized data channels 610 and the forwarded clock signal 512.

Figure 7:
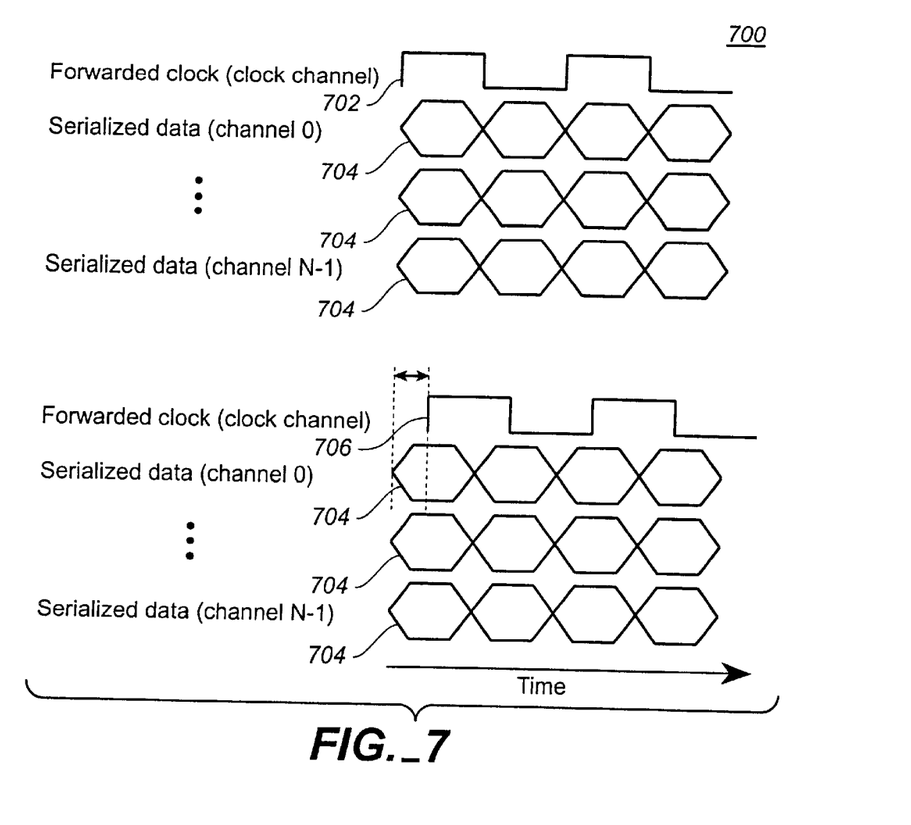
FIG. 7 illustrates a plot of the forwarded clock for a clock serializer generated by the automatic delay matching circuit of FIG. 5.

FIG. 7 illustrates a plot 700 of the forwarded clock for a clock serializer generated by the automatic delay matching circuit of FIG. 5. Shown in FIG. 7 are a forwarded clock signal 702 with no phase offset, serialized data 704, and a forwarded clock signal 706 with a selected phase offset. The phase offset may be used, for example, to compensate for delay mismatch between the data channel and the clock channel resulting from printed circuit board trace delays.

In another aspect of the present invention, a method of delay matching for a data serializer includes steps for synthesizing a transmitter clock signal, delaying or advancing the transmitter clock signal in response to a phase control signal to generate a delayed or advanced transmitter clock signal, measuring a phase difference between the transmitter clock signal delayed through an external circuit and the delayed or advanced transmitter clock signal further delayed through the data serializer, and generating the phase control signal as a function of the phase difference between the delayed or advanced transmitter clock signal further delayed through the data serializer and the transmitter clock signal delayed through the external circuit.

Figure 8:
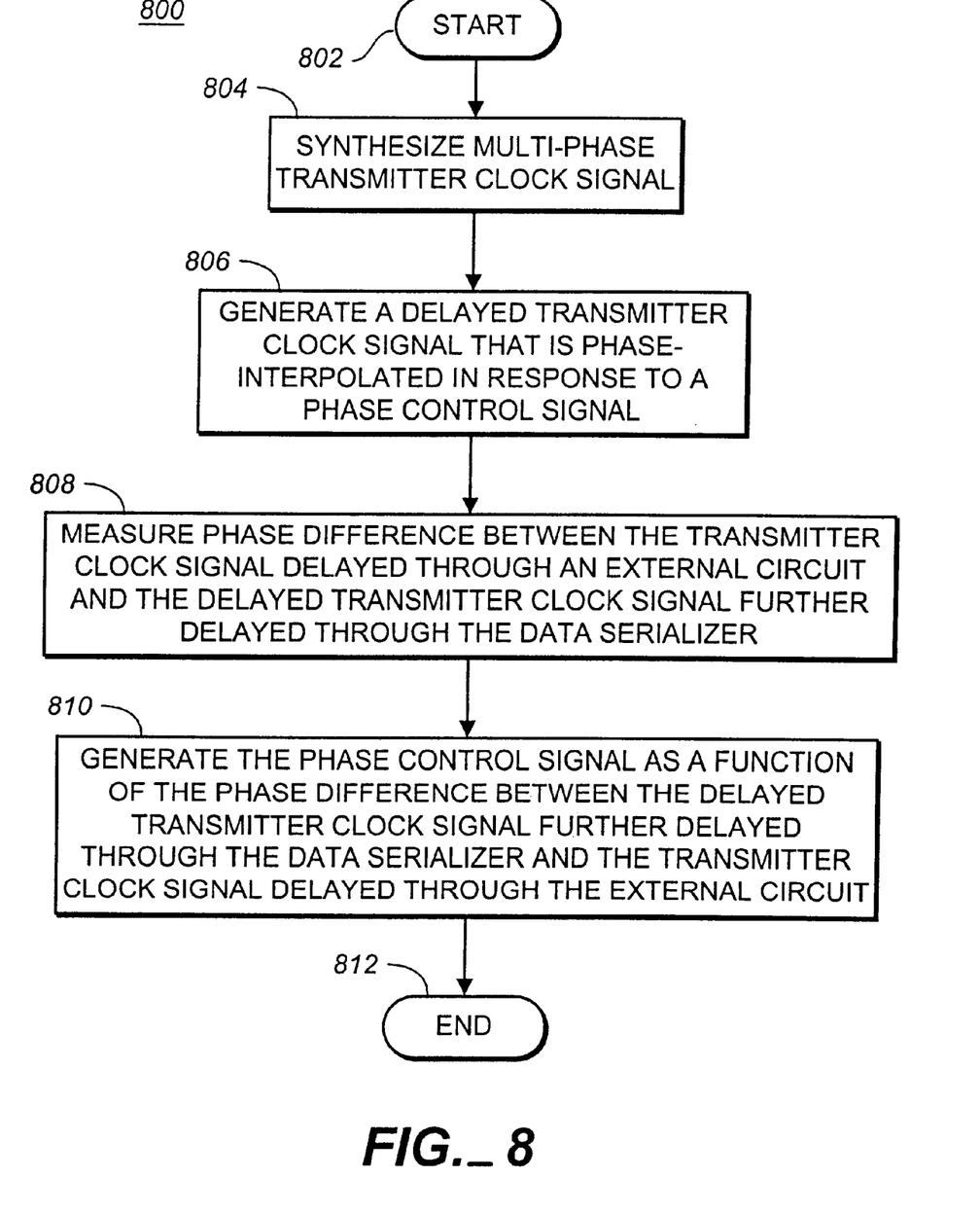
FIG. 8 illustrates a flow chart for a method of matching delay for a data serializer and an ASIC according to an embodiment of the present invention.

FIG. 8 illustrates a flow chart 800 for a method of matching delay for a data serializer and a clock serializer according to an embodiment of the present invention.

Step 802 is the entry point of the flow chart 800.

In step 804, a transmitter clock signal is synthesized according to well-known techniques.

In step 806, the transmitter clock signal is delayed in response to a phase control signal to generate a delayed transmitter clock signal.

In step 808, a phase difference is measured between the transmitter clock signal delayed through an external circuit and the delayed or advanced transmitter clock signal further delayed through the data serializer.

In step 810, the phase control signal is generated as a function of the phase difference between the delayed or advanced transmitter clock signal further delayed through the data serializer and the transmitter clock signal delayed through the external circuit. In response to the phase control signal, the phase difference between the transmitter clock signal delayed through an external circuit and the delayed or advanced transmitter clock signal further delayed through the data serializer is reduced to substantially zero.

Step 812 is the exit point of the flow chart 800.

Although the methods of the present invention illustrated by the flowchart descriptions above are described and shown with reference to specific steps performed in a specific order, these steps may be combined, sub-divided, or reordered without departing from the scope of the claims. Unless specifically indicated herein, the order and grouping of steps is not a limitation of the present invention.

While the invention herein disclosed has been described by means of specific embodiments and applications thereof, numerous modifications and variations could be made thereto by those skilled in the art without departing from the scope of the invention set forth in the following claims.

What is claimed is:

1. An automatic delay matching circuit for a data serializer comprising:
    a phase-locked loop for synthesizing a transmitter clock signal for an external circuit;
    a phase interpolator coupled to the phase-locked loop for delaying or advancing the transmitter clock signal in response to a phase control signal to generate a delayed or advanced transmitter clock signal for the data serializer;
    a phase detector for measuring a phase difference between the delayed or advanced transmitter clock signal further delayed through the data serializer and the transmitter clock signal delayed through an external circuit; and
    a loop filter coupled to the phase detector for generating the phase control signal as a function of the phase difference between the delayed or advanced transmitter clock signal further delayed through the data serializer and the transmitter clock signal delayed through the external circuit.

2. The automatic delay matching circuit of claim 1 wherein the external circuit is coupled to the data serializer for transferring parallel data between the data serializer and the external circuit.

3. The automatic delay matching circuit of claim 1 wherein the phase interpolator delays or advances the transmitter clock signal so that the phase difference between the delayed or advanced transmitter clock signal further delayed through the data serializer and the transmitter clock signal delayed through the external circuit is substantially zero.

4. The automatic delay matching circuit of claim 1 wherein the external circuit is an ASIC core.

5. The automatic delay matching circuit of claim 1 further comprising a second phase interpolator coupled to the phase-locked loop for delaying or advancing the transmitter clock signal in response to a second phase control signal to generate a second delayed or advanced transmitter clock signal for a clock serializer in the external circuit.

6. The automatic delay matching circuit of claim 5 wherein the second phase control signal is a function of the first phase control signal.

7. The automatic delay matching circuit of claim 5 wherein the second phase interpolator delays or advances the transmitter clock signal so that the second delayed or advanced transmitter clock signal has a selected delay relative to the transmitter clock signal to compensate for delay mismatch between the data serializer and the clock serializer.

8. A method of delay matching for a data serializer comprising steps for:
    synthesizing a transmitter clock signal;
    delaying or advancing the first transmitter clock signal in response to a phase control signal to generate a delayed or advanced transmitter clock signal;
    measuring a phase difference between the transmitter clock signal delayed through an external circuit and the delayed or advanced transmitter clock signal further delayed through the data serializer; and
    generating the phase control signal as a function of the phase difference between the delayed transmitter clock signal further delayed through the data serializer and the transmitter clock signal delayed through the external circuit.

9. The method of claim 8 further comprising a step for coupling the external circuit to the data serializer for transferring parallel data between the data serializer and the external circuit.

10. The method of claim 8 wherein the step for delaying or advancing the transmitter clock signal delays or advances the transmitter clock signal so that the phase difference between the transmitter clock signal delayed through the external circuit and the delayed or advanced transmitter clock signal further delayed through the data serializer is substantially zero.

11. The method of claim 8 wherein the external circuit is an ASIC core.

12. The method of claim 8 further comprising a step for delaying or advancing the transmitter clock signal in response to a second phase control signal to generate a second delayed or advanced transmitter clock signal.

13. The method of claim 12 further comprising a step for selecting a delay for the second delayed transmitter clock signal relative to the transmitter clock signal to compensate for delay mismatch between the data serializer and the clock serializer.

* * * * *